United States Patent
Sanchez et al.

[11] Patent Number: 6,040,729
[45] Date of Patent: Mar. 21, 2000

[54] DIGITAL OUTPUT BUFFER FOR MULTIPLE VOLTAGE SYSTEM

[75] Inventors: Hector Sanchez, Cedar Park; Jose M. Alvarez, Leander; Joshua Siegel; Carmine Nicoletta, both of Austin, all of Tex.

[73] Assignee: Motorola, Inc., Schaumburg, Ill.

[21] Appl. No.: 08/917,306

[22] Filed: Aug. 25, 1997

[51] Int. Cl.[7] .............................................. H03K 17/687
[52] U.S. Cl. ........................ 327/309; 327/378; 327/437; 327/108; 327/321; 327/362; 326/81; 326/68
[58] Field of Search .................................. 327/310, 333, 327/437, 108, 362, 318, 378, 379, 384, 386, 387, 388, 321; 326/62, 81, 68

[56] References Cited

U.S. PATENT DOCUMENTS

| | | | |
|---|---|---|---|
| 4,820,942 | 4/1989 | Chan | 327/310 |
| 4,961,010 | 10/1990 | Davis | 326/27 |
| 5,083,051 | 1/1992 | Whatley et al. | 327/310 |
| 5,396,128 | 3/1995 | Dunning et al. | 326/68 |
| 5,546,019 | 8/1996 | Liao | 326/81 |
| 5,680,069 | 10/1997 | Okumura | 327/333 |
| 5,717,355 | 2/1998 | Martin | 327/374 |

*Primary Examiner*—Dinh Le
*Attorney, Agent, or Firm*—Paul J. Polansky

[57] ABSTRACT

An output buffer translates digital input signals which toggle between ground and $V_{DDL}$ to signals which toggle between ground and $V_{DDH}$. The technology dielectric breakdown voltage limit is less than the magnitude of $V_{DDH}$, such that use of a traditional output stage would subject transistors' dielectrics to voltages which exceed their dielectric breakdown limit, and would thus be damaged. Predrive circuits (40, 50) control output stage (70) transistors' (72, 78) gates, and voltage dropping circuits control output stage (70) transistors (74, 76). These control signals are generated specifically to maximize output stage transistor drive strengths, thereby minimizing output stage size. Output buffer functions when $V_{DDL}=V_{DDH}$, and its performance is $V_{DDL}$ independent. Temperature compensation is incorporated into the output buffer by deliberately offsetting temperature effects on output stage transistor drive strengths. Desired performance and temperature compensation are accomplished without subjecting any dielectrics to voltages which exceed the technology dielectric breakdown limit.

22 Claims, 5 Drawing Sheets

DIGITAL OUTPUT BUFFER FOR MULTIPLE VOLTAGE SYSTEM

CROSS REFERENCE TO RELATED APPLICATION

This application is related to the following copending applications:

1. U.S. patent application Ser. No. 08/757,978 entitled "Circuitry and Method for Translating Voltages" filed by International Business Machines Corporation on Nov. 27, 1996, now U.S. Pat. No. 5,777,490, issued Jul. 7, 1998; and
2. U.S. patent application Ser. No. 08/851,261, entitled "A Static Pulsed Cross-Coupled Level Shifter and Method Therefor", filed on May 5, 1997, invented by Joshua Siegel, Hector Sanchez, and Chai-Chin Chao and assigned to the assignee hereof.

FIELD OF THE INVENTION

This invention relates to electrical circuits, and more particularly, to digital output buffer circuits.

BACKGROUND OF THE INVENTION

Semiconductor technologies continuously evolve such that leading edge semiconductors have decreased geometries of transistor sizes and decreased voltages for voltage supplies. The smaller transistors are now manufactured with very thin gate oxide material. As a result, the dielectric breakdown voltage for such transistors in the leading edge semiconductor products has decreased. Thus, a decreased voltage supply is both desirable in order to reduce power consumption and necessary in order to avoid damaging the very thin gate oxide material. Meanwhile, other semiconductor products coupled to the leading edge semiconductor products still have much higher breakdown voltage devices, and utilize higher supply voltages.

For many years, semiconductor designers have dealt with the problem of translating between various levels of supply voltages. For example, when technology transferred between TTL (Transistor to Transistor Logic) to MOS (Metal Oxide Silicon) technology there was a need for voltage level shifting to be performed between the TTL and MOS technologies. Additionally, as supply voltages gradually decreased from 15 volts to 5 volts to 3 volts, designers created interface circuits which could operate between different voltage systems. However, most of those designs were focused on the issue of being able to just interface between one system operating at one voltage and a second system operating at a different voltage. Such systems typically did not have the problem of coping with breakdown voltages of transistors being threatened by the higher voltage system.

There are many chips and integrated circuits such as memories, memory controllers, and other peripherals that work with leading edge microprocessors. However, such peripherals and memories have not changed their supply voltages or reduced their voltage levels nearly as quickly as microprocessors have. In being able to interface between a peripheral circuit that has a much higher voltage than a leading edge integrated circuit, such as a microprocessor, designers often use a well biasing technique to try to minimize the impact in an integrated circuit of receiving a voltage signal much higher than the supply voltage intended for that integrated circuit. The well bias technique which is used eliminates a charge drain from the output node to an output stage power supply within the circuit. Prior circuits typically dealt with receiving higher voltage levels and using those voltage levels in a system operating at a lower voltage level. However, such systems did not typically worry about or have to compensate for transistor damage due to thin gate oxides. As technologies have evolved, the maximum voltage permitted across a transistor has decreased much faster than the decrease of supply voltages for the output bus. As a result, a need exists for a circuit and method which is able to guarantee the integrity of transistors and transistor gate oxides when interfacing with very high supply voltages at the output bus.

A known circuit for dealing with protecting gate oxides when coupling to an output bus having a higher supply voltage than the circuit supply voltage is illustrated in FIG. 1. An output buffer 10 has an input portion 11, an intermediate portion 12, and an output portion 13. In input portion 11, a P-channel transistor 15 has a source connected to a first (higher voltage) supply voltage $V_{DDH}$, a gate connected to a node 24, and a drain connected to a node 17. A P-channel transistor 18 has a source connected to the supply voltage $V_{DDH}$, and a gate connected a drain thereof at node 17. An N-channel transistor 20 has a drain connected to node 17, a gate connected to a second (lower voltage) supply voltage $V_{DDL}$, and a source connected to a drain of an N-channel transistor 21. The gate of transistor 21 is connected to the DATA INPUT terminal, and a source of transistor 21 is connected to a ground terminal. Intermediate portion 12 includes an inverter 23 and an inverter 26 connected via a node 24 which is also connected to the gate of P-channel transistor 15. Inverters 23 and 26 are connected between the first supply voltage $V_{DDH}$ and the second supply voltage $V_{DDL}$. The output portion 13 comprises P-channel transistors 28 and 29 and N-channel transistors 31 and 32. P-channel transistor 28 has a source connected to the first supply voltage $V_{DDH}$, a gate connected to the output of inverter 26, and a drain connected to a source of transistor 29. P-channel transistor 29 has a gate connected to supply voltage $V_{DDL}$, and a drain connected to a chip output terminal. N-channel transistor 31 has a drain connected to the chip output terminal, a gate connected to supply voltage $V_{DDL}$, and a source connected to a drain of N-channel transistor 32. N-channel transistor 32 has a gate connected to the complement of the "DATA INPUT" signal, and has a source connected to the ground terminal.

In operation, circuit 10 is an output buffer with an input portion 11 which consumes DC power. Input portion 11 functions as a level shift stage. When the input data has a logic high level, node 17 is driven low by the input portion 11. However, node 17 does not assume a ground level potential, but rather node 17 is at a level which is driven below $V_{DDL}$. Once node 17 is driven below $V_{DDL}$, the first inverter 23 drives node 24 to the $V_{DDH}$ supply level. As a result, inverter 26 transitions the gate of transistor 28 to $V_{DDL}$ so that transistor 28 is made conductive. As a result, the chip output terminal is driven to the $V_{DDH}$ value. In the illustrated form, $V_{DDL}$ is a lower voltage magnitude than $V_{DDH}$, and $V_{DDH}$ exceeds the maximum permitted voltage of the gate-to-source voltage, $V_{GS}$, of each of the transistors of buffer 10. However, the difference between the $V_{DDH}$ voltage level and the $V_{DDL}$ voltage level is less than the maximum gate-to-source/drain voltage allowed in the technology in which buffer 10 is implemented.

When the DATA INPUT signal is at a logic low level, N-channel transistor 21 isolates node 17 from the ground terminal, and node 17 transitions to the $V_{DDH}$ potential. As a result, inverter 23 transitions node 24 to supply voltage $V_{DDL}$ and inverter 26 transitions the gate of transistor 28 to $V_{DDH}$ which makes transistor 28 non-conductive. Furthermore, transistor 32 is conductive and thus the chip output signal transitions to the ground terminal potential. Note in summary that output buffer 10 operates to consume power in the input portion 11 when the DATA INPUT signal is at logic high state. When the DATA INPUT signal is at a logic low state, power is not consumed. Although the power consumption of output buffer 10 is a potential problem for many applications, output buffer 10 functions to allow the circuit to interface with a system having a higher supply voltage. Additionally, output buffer 10 does not permit a voltage between the gate to source electrodes of each transistor which would destroy the gate oxide of that transistor.

Additionally output buffer 10 suffers from various limitations. If the two voltages are equal: $V_{DDH}=V_{DDL}$, output buffer 10 is not functional. The reason is that level shifted inverters do not work. It is common practice for a manufacturer of an Integrated Circuit to set voltage $V_{DDH}$ to $V_{DDL}$ during the debug phase of a design as well as for simplicity of test equipment during stress testing, such as is done in "burn-in" testing. Furthermore, the propagation delays of output buffer 10 do not track well as process technology, temperature, and voltage change, since transistors 28 and 32 are decoupled and are not driven from the same source. Part of this problem arises because the high and low output propagation paths differ significantly in circuit topology. Also note that output stage 13 tends to consume more active power than desired due to increased "crowbar" or short-circuit current due to different switching times through the two propagation paths since transistors 28 and 32 are decoupled.

BRIEF DESCRIPTION OF THE DRAWINGS

The features and advantages of the present invention will be more clearly understood from the following detailed description taken in conjunction with the accompanying Figures. where like numerals refer to like and corresponding parts and in which.

DETAILED DESCRIPTION

Figure 1:
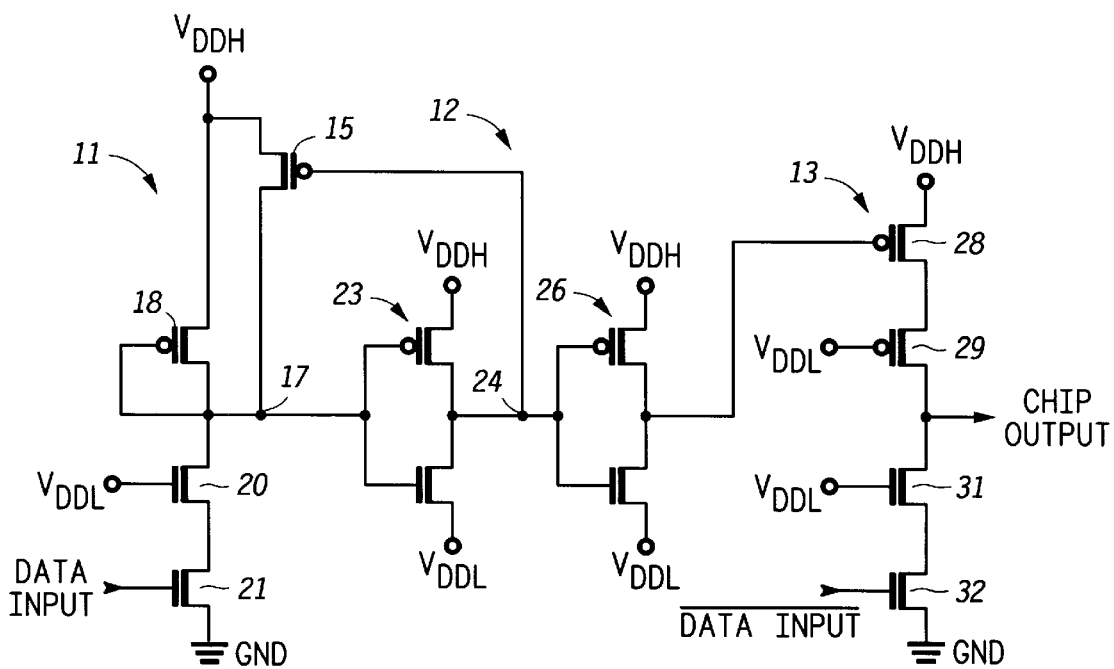
FIG. 1 illustrates in schematic form a known output buffer for interfacing between two supply voltages of differing magnitude.

The output buffers presented herein operate correctly even if voltages $V_{DDH}=V_{DDL}$. Propagation delays high to low and low to high track over process technology, temperature, and voltage changes since the output stage is driven from a common signal. Crowbar or short-circuit current is minimized as well since both high and low propagation paths switch together. Also importantly, transistors are biased as closely as possible to a given technology's maximum gate to source voltage to provide higher performance and smaller resulting circuit. The propagation delays of the output buffers disclosed herein are strictly a function of the $V_{DDH}$ level, and are not dependent upon the difference in voltage between $V_{DDH}$ and $V_{DDL}$ as in output buffer 10 in FIG. 1.

Figure 2:
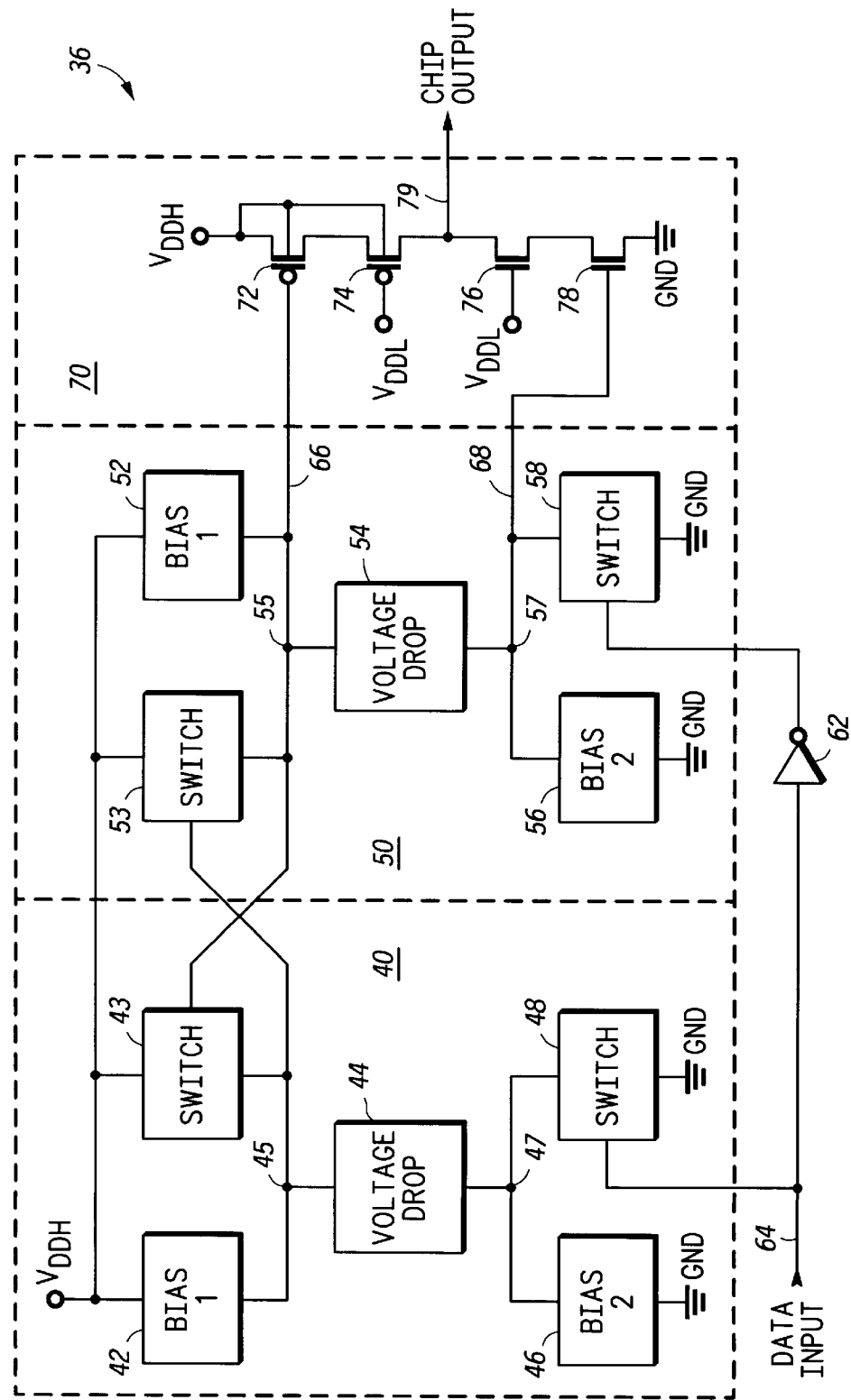
FIG. 2 illustrates in partial schematic and partial block diagram form an output buffer in accordance with one embodiment of the present invention.

FIG. 2 is a block diagram that illustrates one version of a digital output buffer for multiple voltage system 36. Three stages or parts are shown: a first dual output voltage limiting inverter 40, a second dual output voltage limiting inverter 50, and an output stage 60. Both the first dual output voltage limiting inverter 40 and the second dual output voltage limiting inverter 50 have nearly identical structure and functionality.

The first dual output voltage limiting inverter 40 contains a first bias circuit 46 coupled in series between a first terminal 47 of a voltage drop circuit 44 and ground. Also coupled to the first terminal 47 of the voltage drop circuit 44 is a switch 48 to ground controlled by the DATA INPUT signal 64. The first terminal of the voltage drop circuit 44 provides a first output. Coupled between a second terminal 45 of the voltage drop circuit 44 and a output voltage $V_{DDH}$ is a second bias circuit 42. Also coupled to the second terminal 45 of the voltage drop circuit 44 is a switch 43 to $V_{DDH}$. The second terminal of the voltage drop circuit 44 provides a second output.

The second dual output voltage limiting inverter 50 contains a first bias circuit 56 coupled in series between a first terminal 57 of a voltage drop circuit 54 and ground. Also coupled to the first terminal 57 of the voltage drop circuit 54 is a switch 58 to ground controlled by an inverted 62 DATA INPUT 64 signal. The first terminal 57 of the voltage drop circuit 54 provides a first output signal 68. Coupled between a second terminal 55 of the voltage drop circuit 54 and the output voltage $V_{DDH}$ is a second bias circuit 52. Also coupled to the second terminal 55 of the voltage drop circuit 54 is a switch 53 to $V_{DDH}$. The second terminal 55 of the voltage drop circuit 54 provides a second output signal 66. The second switch 43 of the first dual output voltage limiting inverter 40 is controlled by the second terminal 55 of the dual output voltage limiting inverter 50, and the second switch 53 of the second dual output voltage limiting inverter 50 is controlled by the second terminal 45 from the first dual output voltage limiting inverter 40.

BIAS1 and BIAS2 are chosen such that the potential across voltage drop 44, 54 allows the voltages across the dielectrics of switches 43, 48, 53, 58 to reach but not exceed the maximum dielectric voltage permitted in the technology. The voltage drop circuits 44, 54 provide a constant voltage drop. Though a resistor is one possible implementation, it is far from optimum. Two preferred embodiments are further disclosed hereinbelow in FIGS. 4 and 5.

The output stage 70 consists of four transistors in series between $V_{DDH}$ and ground. A first P-channel transistor 72 controlled by the second output signal 66 from the second dual output voltage limiting inverter 50 has its source coupled to $V_{DDH}$ and its drain coupled to the source of a second P-channel transistor 74. The first N-channel transistor 78 controlled by the first output signal 68 from the second dual output voltage limiting inverter 50 has its source coupled to ground and its drain coupled to a source of a second N-channel transistor 76. The drains of the second P-channel transistor 74 and the second N-channel transistor 76 are coupled together to provide a CHIP OUTPUT signal 79 and are both controlled by BIASP and BIASN, respectively.

Figure 3:
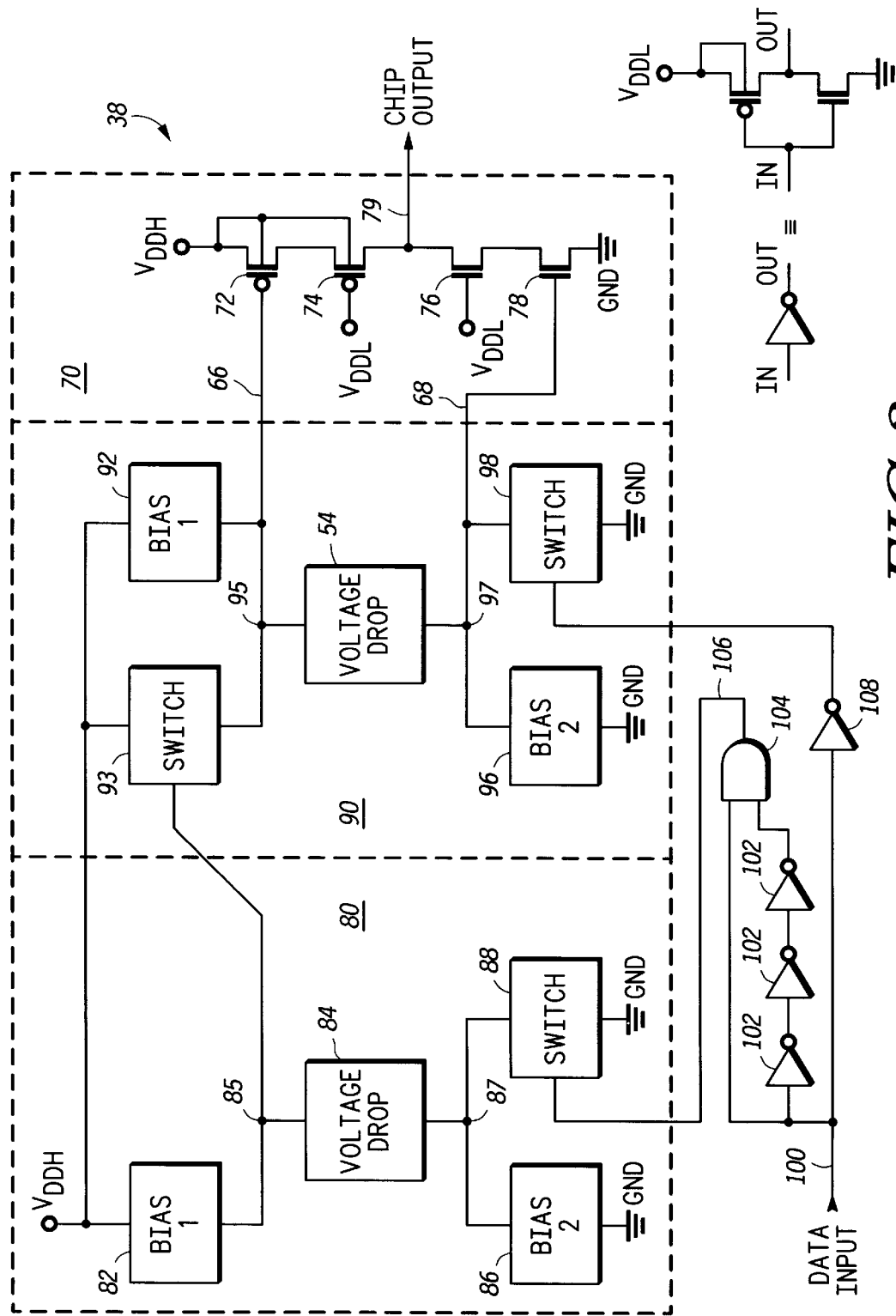
FIG. 3 illustrates in partial schematic and partial block diagram form an output buffer in accordance with a second embodiment of the present invention.

FIG. 3 is a block diagram that illustrates one version of a digital output buffer for multiple voltage system. Three stages or parts are shown: a first dual output voltage limiting inverter 80, a second dual output voltage limiting inverter 90, and an output stage 60. Both the first dual output voltage limiting inverter 80 and the second dual output voltage limiting inverter 90 have nearly identical structure and functionality.

The first dual output voltage limiting inverter 80 contains a first bias circuit 86 coupled in series between a first terminal 87 of a voltage drop circuit 84 and ground. Also coupled to the first terminal 87 of the voltage drop circuit 84 is a switch 88 to ground controlled by output 106 from a pulse generator. The pulse generator receives its input from the DATA INPUT signal 100 and comprises an odd number of inverters 102 in series as one input to an AND gate 104. The second input to the AND gate 104 is the DATA INPUT signal 100. The width of the pulse is the time it takes for a pulse to transit the number of inverters 102 in the pulse generator. The output 106 of the AND gate 104 is the output of the pulse generator that controls the switch 88 to ground. The first terminal of the voltage drop circuit 84 provides a first output. Coupled between a second terminal 85 of the voltage drop circuit 84 and a output voltage $V_{DDH}$ is a second bias circuit 82. The second terminal of the voltage drop circuit 84 provides a second output.

The second dual output voltage limiting inverter 90 contains a first bias circuit 96 coupled in series between a first terminal 97 of a voltage drop circuit 94 and ground. Also coupled to the first terminal 97 of the voltage drop circuit 94 is a switch 98 to ground controlled by an inverted 108 DATA INPUT 100 signal. The first terminal 97 of the voltage drop circuit 94 provides a first output signal 68. Coupled between a second terminal 95 of the voltage drop circuit 94 and the output voltage $V_{DDH}$ is a second bias circuit 92. Also coupled to the second terminal 95 of the voltage drop circuit 94 is a switch 93 to $V_{DDH}$. The second terminal 95 of the voltage drop circuit 54 provides a second output signal 66. The second switch 93 of the second dual output voltage limiting inverter 90 is controlled by the second terminal 85 from the first dual output voltage limiting inverter 80.

The output stage 70 consists of four transistors in series between $V_{DDH}$ and ground. A first P-channel transistor 72 controlled by the second output signal 66 from the second dual output voltage limiting inverter 90 has its source coupled to the first supply voltage $V_{DDH}$ and its drain coupled to the source of a second P-channel transistor 74. The gate of a first N-channel transistor 78 is controlled by the first output signal 68 from the second dual output voltage limiting inverter 90, and its source is coupled to ground and its drain is coupled to a source of a second N-channel transistor 76. The drains of the second P-channel transistor 74 and the second N-channel transistor 74 are coupled together to provide a CHIP OUTPUT signal 79 and are both controlled by bias voltages BIASP and BIASN.

Note that the pulse generator output 106 essentially replaces the need for the first switch 43 to $V_{DDH}$ in FIG. 2. This embodiment allows a much larger second bias circuit 82 to be used, since the time in which it is enabled is substantially shortened due to the pulse generated by the ANDing of the output of the inverters 102 with the DATA INPUT signal 100. Furthermore, this embodiment allows a substantially faster propagation through the output buffer.

A blownup schematic of the inverters 62, 102, 108 illustrated in FIGS. 2 and 3 is also shown. It is a standard inverter comprised of one N-channel transistor and one P-channel transistor. Note though that the drain of the P-channel transistor as well as its well bias are both tied to the second supply voltage ($V_{DDL}$). This second supply voltage ($V_{DDL}$) is usually the reference voltage of the interior of the integrated circuit, whereas the first reference voltage ($V_{DDH}$) is used on the exterior of the integrated circuit. The AND gate 104 is similarly constructed to contain transistors connected to $V_{DDL}$.

Figure 4:
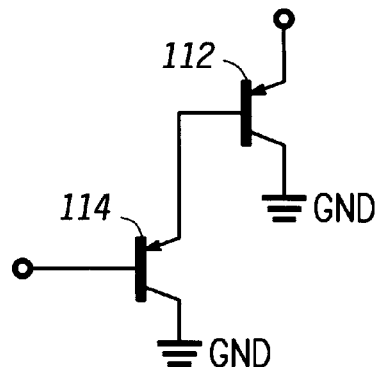
FIG. 4 illustrates in schematic form one embodiment of the voltage dropping elements of FIGS. 2 and 3.

FIG. 4 illustrates in schematic form one embodiment of the voltage dropping elements of FIGS. 2 and 3. Voltage dropping element 110 includes a first PNP transistor 112 and a second PNP transistor 114. Transistor 112 has an emitter providing the first terminal of voltage dropping element 110, a base, and a collector connected to ground. Transistor 114 has an emitter connected to the base of transistor 112, a base forming the second terminal of voltage dropping element 110 and a collector connected to ground.

In operation, voltage dropping element 110 provides a voltage drop which is equal to two (2) diode voltage drops formed by the emitter-base junction of collector 112 in series with the emitter-base junction of transistor 114. In processes where vertical PNP transistors such as transistors 112 and 114 are available, voltage dropping element 110 provides an exponential current voltage characteristic. This is desirable because the current through the PNP transistor increases exponentially as its voltage increases, which is faster than a linear or quadratic increase. Thus, voltage dropping element 110 is preferable to other types of voltage dropping elements such as resistors, diode connected MOS transistors and the like. In particular, voltage dropping element 110 may be advantageously implemented using a conventional CMOS process. In such a case, the emitter of transistors 112 and 114 are formed by a P+ diffusion in an N-well, the base being formed by the N-well and the collector by the P-substrate and thus transistors 112 and 114 represent the parasitic bipolar transistors formed in P-substrate N-well CMOS integrated circuits.

Figure 5:
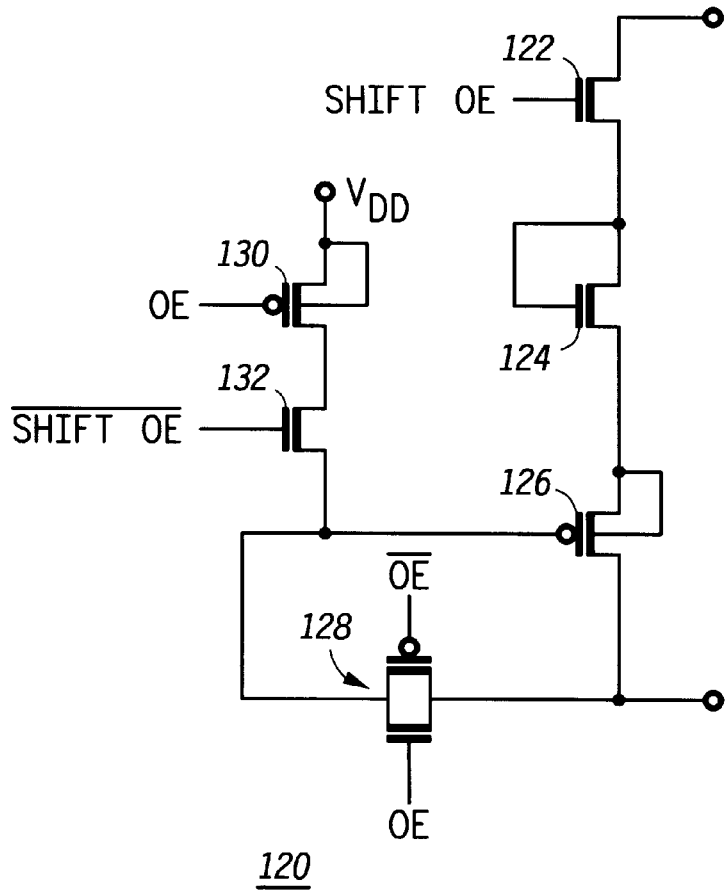
FIG. 5 illustrates in schematic form a second embodiment of the voltage dropping elements of FIGS. 2 and 3.

FIG. 5 illustrates in schematic form a second embodiment 120 of the voltage dropping elements of FIGS. 2 and 3. Voltage dropping element 120 represents a voltage dropping element formed in a CMOS process and further including disabling circuitry to reduce steady state or DC current consumption. Voltage dropping element 120 includes N-channel transistors 122 and 124, a CMOS transmission gate 128, a P-channel transistor 130, an N-channel transistor 132, and a P-channel transistor 126. Transistor 122 has a drain forming the first terminal of voltage dropping element 120, a gate for receiving a signal label "SHIFT OE" and a source. Transistor 124 has a drain connected to the source of transistor 122, a gate connected to the drain thereof, and a source. Transistor 126 has a source connected to the source of transistor 124, a gate and a drain, and a bulk electrode connected to the source thereof and a drain electrode forming the second terminal of voltage dropping element 120. Transmission gate 128 has a first terminal connected to the gate of transistor 126 and a second terminal connected to the drain of transistor 126. Transmission gate 128 is a conventional CMOS transmission gate formed of a P-channel transistor and an N-channel transistor connected in parallel. Thus, for controlling the conductivity of transmission gate 128, the N-channel transistor receives a signal labeled "OE" on its gate and the P-channel transistor receives a compliment of signal OE labeled "OE" on its gate.

Transistor 130 has a source connected to the first supply voltage $V_{DDL}$, a gate for receiving signal OE and a drain and a bulk connected to the source thereof. Transistor 132 has a drain connected to the drain of transistor 130, a gate for receiving a signal labeled "SHIFT OE" and a source connected to the gate of transistor 126. In operation, voltage dropping element 120 includes a series combination of two diode connected transistors 124 and 126 in conjunction with enabling circuitry. The enabling circuitry includes transistor 122 which prevents current from flowing through transistors 124 and 126 when signal OE is at a logic low state and transmission gate 128 which selectively couples the gate of transistor 126 to the drain thereof thereby forming the diode connection and the series combination of transistors 130 and 132 which act to pull the gate of transistor 126 to the logic high level of signal SHIFT OE minus the threshold voltage of transistor 132. While voltage dropping element 120 provides a less ideal voltage dropping characteristic due to the quadratic current voltage characteristic of MOS transistors it is useful, however, for lower power applications because it can be easily disabled.

Figure 6:
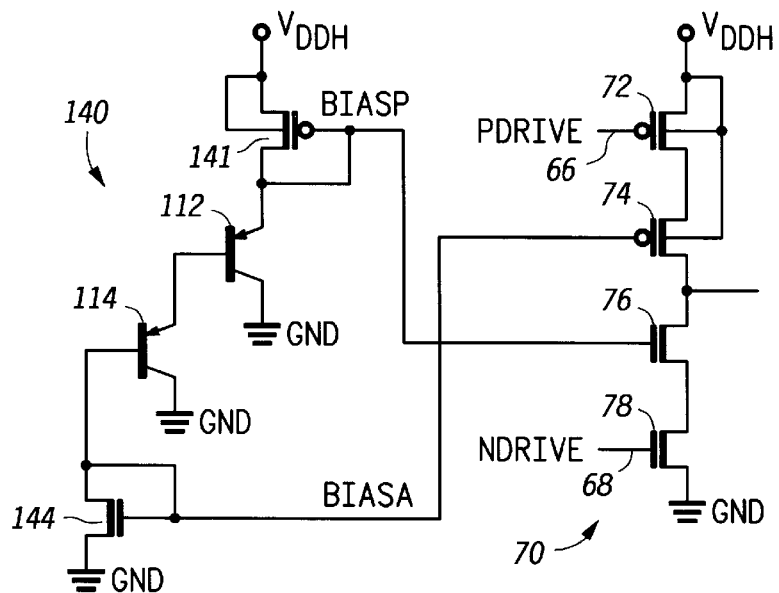
FIG. 6 illustrates in schematic form one embodiment of a bias circuit for use with the output buffers of FIGS. 2 and 3.

FIG. 6 illustrates in schematic form one embodiment 140 of a bias circuit for use with the output buffers of FIGS. 2 and 3. The bias circuit illustrated in FIG. 6 uses voltage dropping element 110 of FIG. 4 and is used to provide the bias voltages for P-channel transistors 74 and 76 as previously illustrated in FIGS. 2 and 3. Bias circuit 140 includes a P-channel transistor 141, bipolar transistors 112 and 114, an N-channel transistor 144, all of which are used in conjunction with output stage 70. Transistor 141 has a source connected to $V_{DDH}$, a gate, a drain connected to the gate thereof for providing a signal labeled "BIAS2" and a bulk connected to the source thereof. Transistor 112 has an emitter connected to the drain of transistor 141, a base, and a collector connected to ground. Transistor 114 has an emitter connected to the base of transistor 112, a base and a collector connected to ground. Transistor 144 has a drain connected to the base of transistor 114, a gate connected to the drain thereof, and a source connected to ground. The drain of transistor 144 provides a signal labeled "BIAS1". Driver stage 70 is connected as previously shown in FIGS. 2 and 3 except that transistor 74 receives signal BIAS1 on the gate thereof and transistor 76 receives signal BIAS2 on the gate thereof. Note that bias circuit 140 provides voltages on the gates of transistors 74 and 76 which are intermediate to power supplies $V_{DDH}$ and ground and thereby prevent the dielectrics of transistors 74 and 76 from exposure to voltage potentials greater than the dielectric breakdown voltage for the technology.

It is important to note that by connecting BIAS2 to the gate of transistor 76 and using a signal NDRIVE generated from BIAS1, the series combination of transistors 76 and 78 provide a roughly constant current drive as temperature varies. As temperature increases, transistor 78 increases in current drive, while transistor 76 proportionately decreases in current drive, thus limiting the current drive of the series combination. As temperature decreases, the current drive of transistor 78 decreases, while the current drive of transistor 76 increases proportionately, thus maintaining approximately the same current drive for the series combination of transistors 76 and 78. So, this technique allows the current drive characteristics of the series combination of transistors 76 and 78 to remain fairly constant across temperature changes. Furthermore, connecting the gate of transistor 74 to BIAS1 and using the signal PDRIVE generated from BIAS2, the same temperature compensation is achieved for the P-channel series combination.

Figure 7:
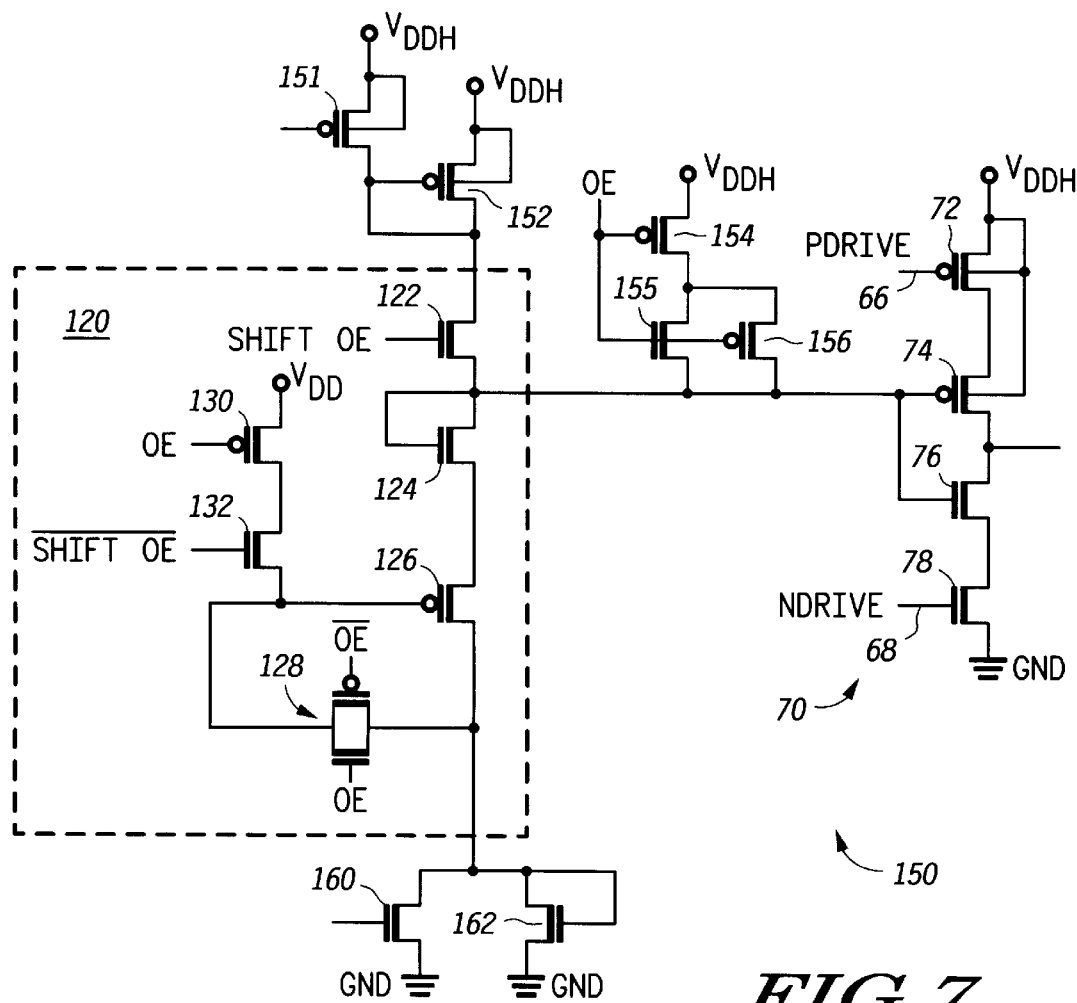
FIG. 7 illustrates in schematic form a second embodiment of a bias circuit for use with the output buffers of FIGS. 2 and 3.

FIG. 7 illustrates in schematic form a second embodiment 150 of a bias circuit for use with the output buffers of FIGS. 2 and 3 and output stage 70. Bias circuit 150 includes P-channel transistors 151, 152 and 154, an N-channel transistor 155, a P-channel transistor 156, and N-channel transistors 160 and 162 used in conjunction with voltage dropping element 120. Transistor 151 has a source connected to $V_{DDH}$, a gate for receiving an input signal which is opposite in polarity to the signal on the gate of transistor 160, a drain, and a bulk connected to the source thereof. Transistor 152 has a source connected to $V_{DDH}$, a drain connected to the drain of transistor 151 and a bulk connected to the source thereof. Voltage dropping element 120 has a first terminal connected to the drains of transistors 151 and 152 and a second terminal. Transistors 152 and 162 operate as BIAS2 and BIAS1, respectively. Transistor 154 has a source connected to $V_{DDL}$, a gate for receiving signal OE and a drain. Transistor 155 has a drain connected to the drain of transistor 154, a gate for receiving signal OE, and a source connected to transistor 74. Transistor 156 has a source connected to the drain of transistor 154, a gate for receiving signal OE, and a drain connected to the gate of transistor 74. Transistor 160 has a drain connected to the second terminal of voltage dropping element 120, a gate for receiving an input signal which is opposite in polarity to the signal on the gate of transistor 151, and a source connected to ground. Transistor 162 has a drain connected to the second terminal voltage dropping element 120, a gate connected to the drain thereof and a source connected to ground. The gate of transistor 76 is also connected to the source of transistor 155, the drain of transistor 156, the gate of transistor 74, and the drain of transistor 124. Note that the drain of transistor 124 in voltage dropping element 120 is used as a further output terminal to bias transistors 74 and 76. When output enable signal is inactive, transistors the gates of transistors 74 and 76 are biased to $V_{DDL}$.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A digital output buffer for a multiple voltage system, comprising:

a first voltage limiting logic circuit having a first power supply terminal for receiving a first voltage, a second power supply terminal for receiving a second voltage, an input terminal for receiving a digital input signal, a first output terminal for providing a first predrive signal, and a second output terminal for providing a second predrive signal;

said digital input signal characterized as having logic levels corresponding to said second voltage and a third voltage;

said first predrive signal having logic levels corresponding to either said first voltage or a first intermediate voltage;

said second predrive signal having logic levels corresponding to either a second intermediate voltage or said second voltage;

a first transistor having a first current electrode for receiving said first voltage, a control electrode for receiving said first predrive signal, and a second current electrode coupled to an output terminal of the digital output buffer; and a second transistor having a first current electrode coupled to said output terminal of the digital output buffer, a control electrode for receiving said second predrive signal, and a second current electrode for receiving said second voltage, a difference between said first voltage and said first intermediate voltage being less than a dielectric breakdown voltage of said first transistor, said first voltage limiting logic circuit comprising:

a first bias element having a first terminal for receiving said first voltage, and a second terminal for providing said first predrive signal;

a voltage dropping element having a first terminal coupled to said second terminal of said first bias element, and a second terminal for providing said second predrive signal; and switching means coupled between said second output terminal of said first voltage limiting logic circuit and said second power supply terminal for providing either said first voltage or said first intermediate voltage to said first output terminal of said first voltage limiting logic circuit in response to said digital input signal.

2. The digital output buffer of claim 1 wherein a difference between said second intermediate voltage and said second voltage is less than a second dielectric breakdown voltage of said second transistor.

3. The digital output buffer of claim 1 further comprising:

a third transistor having a first current electrode coupled to said second current electrode of said first transistor, a control electrode for receiving a first bias voltage, and a second current electrode coupled to said output terminal of the digital output buffer; and a fourth transistor having a first current electrode coupled to said output terminal of the digital output buffer, a control electrode for receiving a second bias voltage, and a second current electrode coupled to said first current electrode of said second transistor.

4. The digital output buffer of claim 3 wherein said first and third transistors are P-channel metal-oxide-semiconductor (MOS) transistors, and wherein said second and fourth transistors are N-channel MOS transistors.

5. The digital output buffer of claim 1 wherein said first voltage limiting logic circuit further comprises:

a second bias element having a first terminal coupled to said second terminal of said voltage dropping element, and a second terminal for receiving said second voltage.

6. The digital output buffer of claim 1 wherein said switching means comprises:

a switch having a first terminal for receiving said second voltage, a control terminal for receiving said digital input signal, and a second terminal coupled to said second terminal of said first bias element.

7. The digital output buffer of claim 5 wherein said switching means comprises:

a switch having a first terminal coupled to said first terminal of said second bias element, a control terminal for receiving said digital input signal, and a second terminal for receiving said first voltage.

8. The digital output buffer of claim 5 wherein said switching means comprises:

a first switch having a first terminal for receiving said first voltage, a control terminal for receiving said digital input signal, and a second terminal coupled to said second terminal of said first bias element; and a second switch having a first terminal coupled to said first terminal of said second bias element, a control terminal for receiving said digital input signal, and a second terminal for receiving said second voltage.

9. The digital output buffer of claim 8 further comprising:

an inverter having a first terminal for receiving a complement of said digital input signal, and an output terminal coupled to said control terminal of said second switch; and a second voltage limiting logic circuit having a first power supply terminal for receiving said first voltage, a second power supply terminal for receiving said second voltage, an input terminal for receiving said complement of said digital input signal, and an output terminal coupled to said control terminal of said first switch.

10. The digital output buffer of claim 1 wherein said voltage dropping element comprises:

a first bipolar transistor having an emitter providing said first terminal of said voltage dropping element, a base, and a collector for receiving said second voltage; and a second bipolar transistor having an emitter coupled to said base of said first bipolar transistor, a base providing said second terminal of said voltage dropping element, and a collector for receiving said second voltage.

11. The digital output buffer of claim 1 wherein said voltage dropping element comprises:

an MOS transistor having a first current electrode providing said first terminal of said voltage dropping element, a gate, and a second current electrode providing said second terminal of said voltage dropping element; and coupling means for coupling said gate of said MOS transistor to said second current electrode thereof selectively in response to an enable control signal.

12. A digital output buffer for a multiple voltage system, comprising:

an inverter having a first terminal for receiving a digital input signal, and an output terminal for providing a complement of said digital input signal;

a pulse circuit having an input terminal for receiving said digital input signal, and an output terminal;

a first voltage limiting logic circuit having a first power supply terminal for receiving a first voltage, a second power supply terminal for receiving a second voltage, an input terminal coupled to said output terminal of said pulse circuit, and a first output terminal;

a second voltage limiting logic circuit having a first power supply terminal for receiving said first voltage, a second power supply terminal for receiving said second voltage, a first input terminal coupled to said output terminal of said first voltage limiting logic circuit, a second input terminal for receiving said complement of said digital input signal, a first output terminal, and a second output terminal;

a first transistor having a first current electrode for receiving said first voltage, a control electrode coupled to said first output terminal of said second voltage limiting logic circuit, and a second current electrode coupled to an output terminal of the digital output buffer; and a second transistor having a first current electrode coupled to said output terminal of the digital output buffer, a control electrode coupled to said second output terminal of said second voltage limiting logic circuit, and a second current electrode for receiving said second voltage.

13. The digital output buffer of claim 12 further comprising:
- a third transistor having a first current electrode coupled to said second current electrode of said first transistor, a control electrode for receiving a first bias voltage, and a second current electrode coupled to said output terminal of the digital output buffer; and
- a fourth transistor having a first current electrode coupled to said output terminal of the digital output buffer, a control electrode for receiving a second bias voltage, and a second current electrode coupled to said first current electrode of said second transistor.

14. The digital output buffer of claim 13 wherein said first and third transistors are P-channel metal-oxide-semiconductor (MOS) transistors, and wherein said second and fourth transistors are N-channel MOS transistors.

15. The digital output buffer of claim 12 wherein each of said first and second voltage limiting logic circuits comprises:
- a first bias element having a first terminal for receiving said first voltage, and a second terminal coupled to said first output terminal;
- a voltage dropping element having a first terminal coupled to said second terminal of said first bias element, and a second terminal;
- a second bias element having a first terminal coupled to said second terminal of said voltage dropping element, and a second terminal for receiving said second voltage; and
- switching means for providing either said second voltage or a first intermediate voltage to said first output terminal in response to said digital input signal.

16. The digital output buffer of claim 15 wherein said switching means of said first voltage limiting logic circuits comprises:
- a switch having a first terminal for receiving said first voltage, a control terminal for receiving said digital input signal, and a second terminal coupled to said first output terminal.

17. The digital output buffer of claim 15 wherein said switching means of said second voltage limiting logic circuit comprises:
- a first switch having a first terminal for receiving said first voltage, a control terminal coupled to said output terminal of said first voltage limiting logic circuit, and a second terminal coupled to said output terminal of said second voltage limiting logic circuit; and
- a second switch having a first terminal coupled to said second terminal of said voltage dropping element, a control terminal for receiving said digital input signal, and a second terminal for receiving said second voltage.

18. A digital output buffer for a multiple voltage system, comprising:
- a first bias element having a first terminal coupled to a first power supply voltage terminal, and a second terminal;
- a voltage dropping element having a first terminal coupled to said second terminal of said first bias element, and a second terminal;
- a switch having a first current electrode coupled to said second terminal of said voltage dropping element, a control electrode for receiving an input signal, and a second current electrode coupled to a second power supply voltage terminal;
- a first transistor having a first current electrode coupled to said first power supply voltage terminal, a control electrode coupled to said second terminal of said first bias element, and a second current electrode coupled to an output terminal of the digital output buffer and providing an output signal thereto; and
- a second transistor having a first current electrode coupled to said second current electrode of said first transistor, a control electrode coupled to said second terminal of said voltage dropping element, and a second current electrode coupled to said second power supply voltage terminal.

19. The digital output buffer of claim 18 wherein said switch comprises a metal-oxide-semiconductor (MOS) transistor.

20. The digital output buffer of claim 18 wherein said first bias element comprises a metal-oxide-semiconductor (MOS) transistor having a first current electrode coupled to said first power supply voltage terminal, a gate, and a drain coupled to said gate thereof.

21. The digital output buffer of claim 18 further comprising a second bias element having a first terminal coupled to said second terminal of said voltage dropping element, and a second terminal coupled to said second power supply voltage terminal.

22. The digital output buffer of claim 18 further comprising:
- a third transistor having a first current electrode coupled to said second current electrode of said first transistor, a control electrode for receiving a first bias voltage, and a second current electrode coupled to said output terminal of the digital output buffer; and
- a fourth transistor having a first current electrode coupled to said output terminal of the digital output buffer, a control electrode for receiving a second bias voltage, and a second current electrode coupled to said first current electrode of said second transistor.

* * * * *